(12) United States Patent
Park

(10) Patent No.: US 8,013,353 B2
(45) Date of Patent: Sep. 6, 2011

(54) LIGHT-EMITTING ELEMENT

(75) Inventor: Hyung Jo Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/812,403

(22) PCT Filed: May 8, 2009

(86) PCT No.: PCT/KR2009/002447
§ 371 (c)(1),
(2), (4) Date: Jul. 9, 2010

(87) PCT Pub. No.: WO2009/136769
PCT Pub. Date: Nov. 12, 2009

(65) Prior Publication Data
US 2010/0289050 A1    Nov. 18, 2010

(30) Foreign Application Priority Data
May 8, 2008    (KR) .................. 10-2008-0042602

(51) Int. Cl.
*H01L 33/00*    (2010.01)
(52) U.S. Cl. ........... 257/98; 257/E33.068; 257/E33.072; 438/27; 438/29
(58) Field of Classification Search ........ 257/98, 257/E33.068, E33.072; 438/27, 29
See application file for complete search history.

(56) References Cited

U.S. PATENT DOCUMENTS

| 5,606,181 A * | 2/1997 | Sakuma et al. ........... 257/88 |
| 2002/0134987 A1 | 9/2002 | Takaoka |
| 2005/0023537 A1 | 2/2005 | Salam |
| 2006/0034084 A1 * | 2/2006 | Matsuura et al. ........ 362/293 |
| 2007/0114550 A1 | 5/2007 | Kato et al. |
| 2007/0228393 A1 | 10/2007 | Yoneda |

FOREIGN PATENT DOCUMENTS

| JP | 58-096781 | 6/1983 |
| JP | 62-076686 | 4/1987 |
| JP | 2004-047704 | 2/2004 |
| JP | 2004-95944 | 3/2004 |
| JP | 2004-128321 A | 4/2004 |
| JP | 2004 128321 A | 4/2004 |
| JP | 2006-332225 A | 12/2006 |
| JP | 2006 332225 A | 12/2006 |
| JP | 2007 294885 A | 11/2007 |
| KR | 10-2006-0018989 A | 3/2006 |
| KR | 10-2007-0111658 | 11/2007 |
| KR | 10 2007 0111658 A | 11/2007 |
| WO | WO 2006/022532 A1 | 3/2006 |
| WO | WO 2007/105868 A1 | 9/2007 |

OTHER PUBLICATIONS

IBM Corporation: "Pillbox Quantum Well Light-Emitting Diode", IBM Technical disclosure Bulletin, vol. 33, No. 1A, Jun. 1, 1990, p. 403-404, XP000117777.

* cited by examiner

*Primary Examiner* — Minh-Loan T Tran
(74) *Attorney, Agent, or Firm* — McKenna Long & Aldridge LLP

(57) ABSTRACT

Disclosed are a light emitting device and a method of manufacturing the same. The light emitting device includes a second electrode layer, a light emitting semiconductor layer including a second conductive semiconductor layer, an active layer, and a first conductive semiconductor layer on the second electrode layer, a reflective member spaced apart from the light emitting semiconductor layer on the second electrode layer, and a first electrode layer on the first conductive semiconductor layer.

5 Claims, 4 Drawing Sheets

US 8,013,353 B2

LIGHT-EMITTING ELEMENT

This application is a 35 U.S.C. §371 national stage filing of International Application No. PCT/KR2009/002447 filed on May 8, 2009, and claims the benefit of Korean Patent Application No. 10-2008-0042602 filed on May 8, 2008, both of which are hereby incorporated by reference herein for all purposes as if fully set forth herein.

TECHNICAL FIELD

The embodiment relates to a light emitting device.

BACKGROUND ART

Recently, various studies and researches have been carried out regarding a device employing a light emitting diode (LED) as a light emitting device.

The LED converts an electrical signal into light by using the characteristic of a compound semiconductor. The LED has the stack structure of a first conductive semiconductor layer, an active layer, and a second conductive semiconductor layer and emits light through the active layer as power is applied thereto. The first conductive semiconductor layer may serve as an N-type semiconductor layer, and the second conductive semiconductor layer may serve as a P-type semiconductor layer, or vice versa.

Meanwhile, in such a light emitting device, the light emitted from the active layer is discharged through a lateral side as well as a top surface of the light emitting device, so that light emitting efficiency may be degraded.

DISCLOSURE

Technical Problem

The embodiment provides a light emitting device having a novel structure and a method of manufacturing the same.

The embodiment provides a light emitting device capable of improving light efficiency in the direction of a top surface thereof and a method of manufacturing the same.

The embodiment provides a light emitting device capable of reflecting laterally emitted light in the direction of the top surface and a method of manufacturing the same.

Technical Solution

According to the embodiment, a light emitting device includes a second electrode layer, a light emitting semiconductor layer including a second conductive semiconductor layer, an active layer, and a first conductive semiconductor layer on the second electrode layer, a reflective member spaced apart from the light emitting semiconductor layer on the second electrode layer, and a first electrode layer on the first conductive semiconductor layer.

According to the embodiment, the light emitting device includes a second electrode layer, a light emitting semiconductor layer including a second conductive semiconductor layer, an active layer, and a first conductive semiconductor layer on the second electrode layer, and a reflective member at an outside of the light emitting semiconductor layer.

Advantageous Effects

The embodiment can provide a light emitting device having a novel structure and a method of manufacturing the same.

The embodiment can provide a light emitting device capable of improving light efficiency in the direction of a top surface thereof and a method of manufacturing the same.

The embodiment can provide a light emitting device capable of reflecting light laterally emitted in the direction of a top surface and a method of manufacturing the same.

BEST MODE

Figure 1:
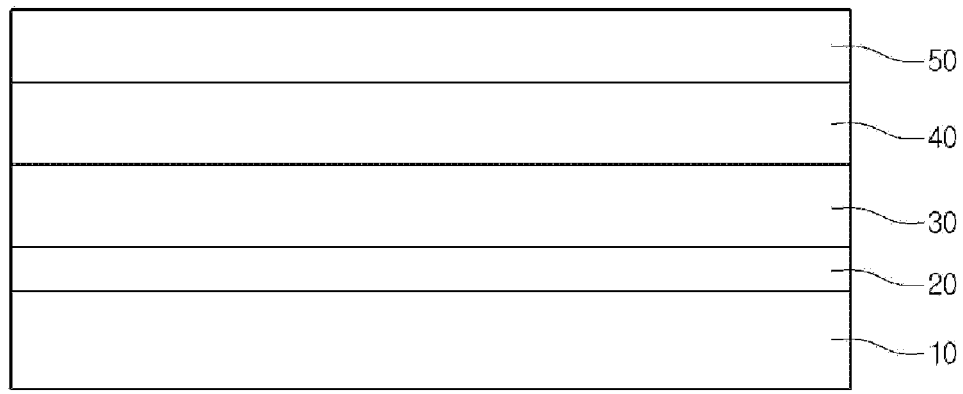
FIGS. 1 and 6 are sectional views showing a light emitting device and a method of manufacturing the same according to a first embodiment of the present invention.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

Figure 6:
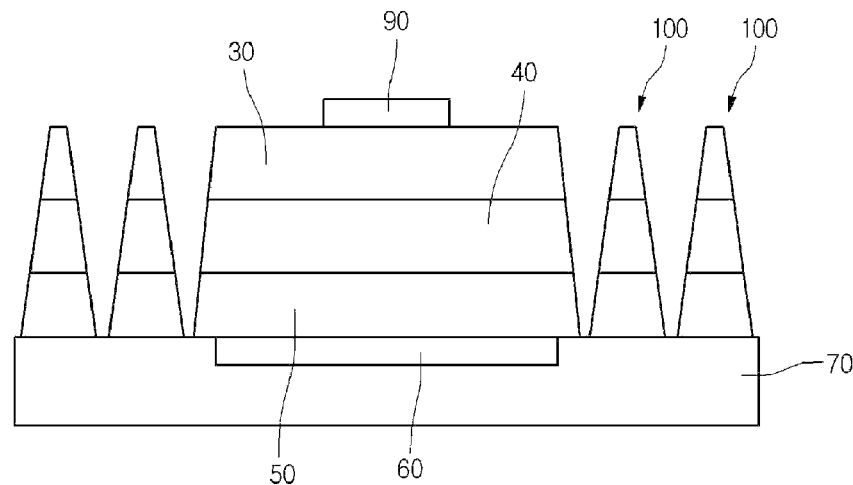
Figure 7:
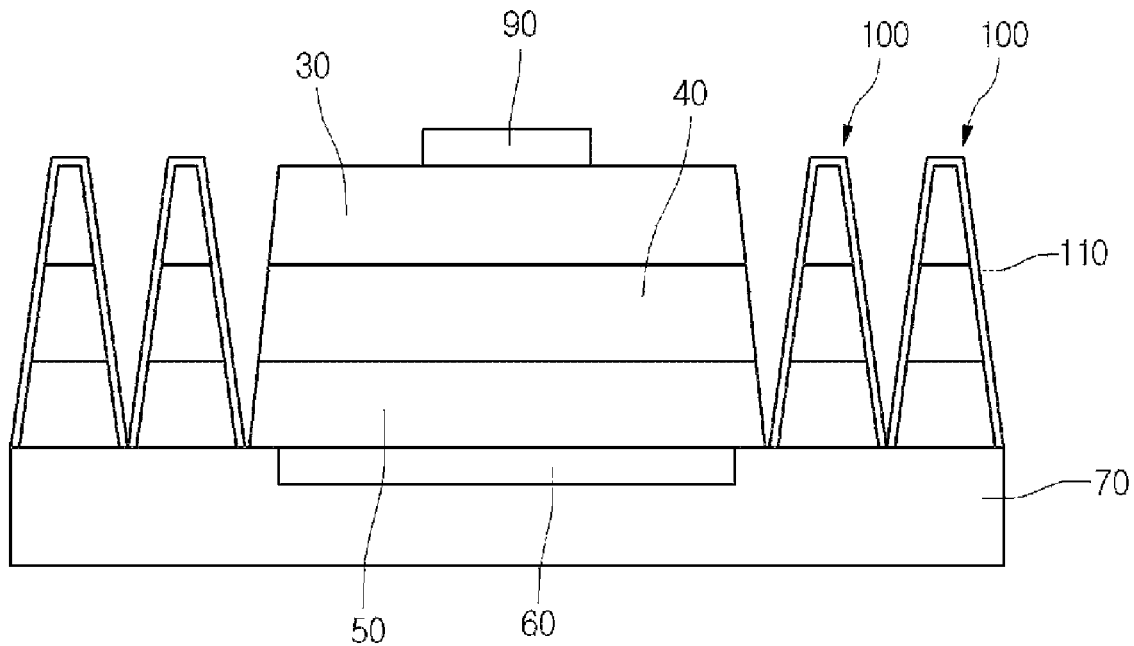
FIG. 7 is a sectional view showing a light emitting device according to a second embodiment of the present invention.
Figure 8:
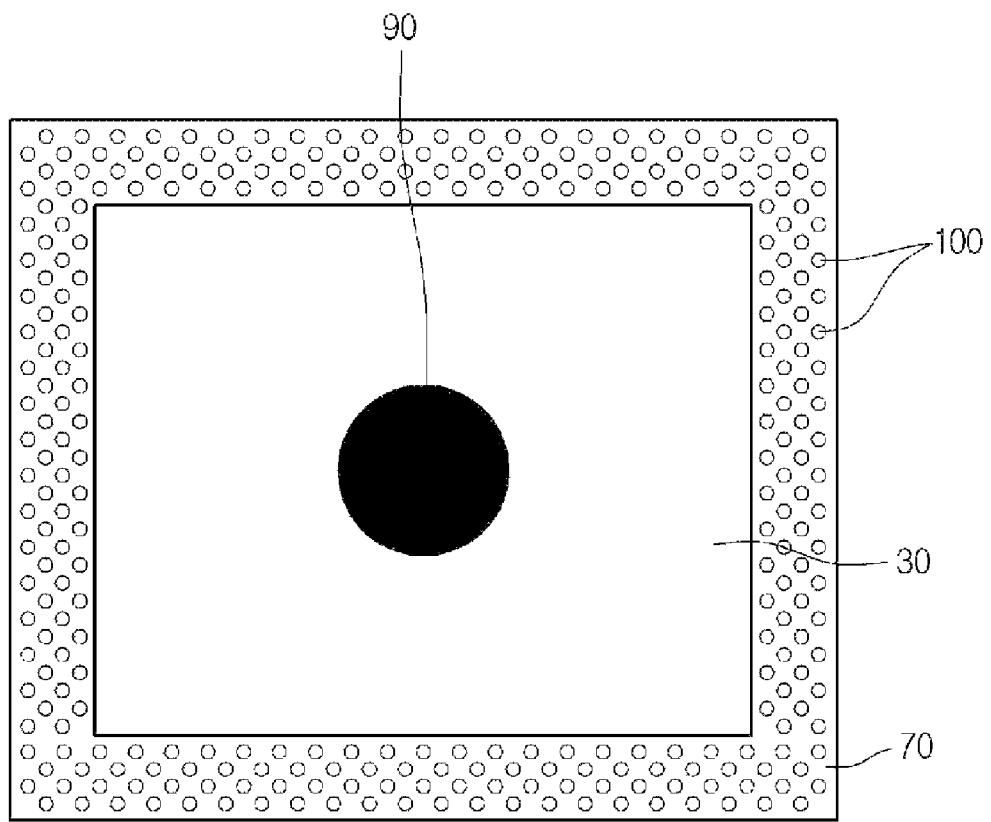
FIG. 8 is a plan view showing the light emitting device according to the embodiments of the present invention.
Figure 9:
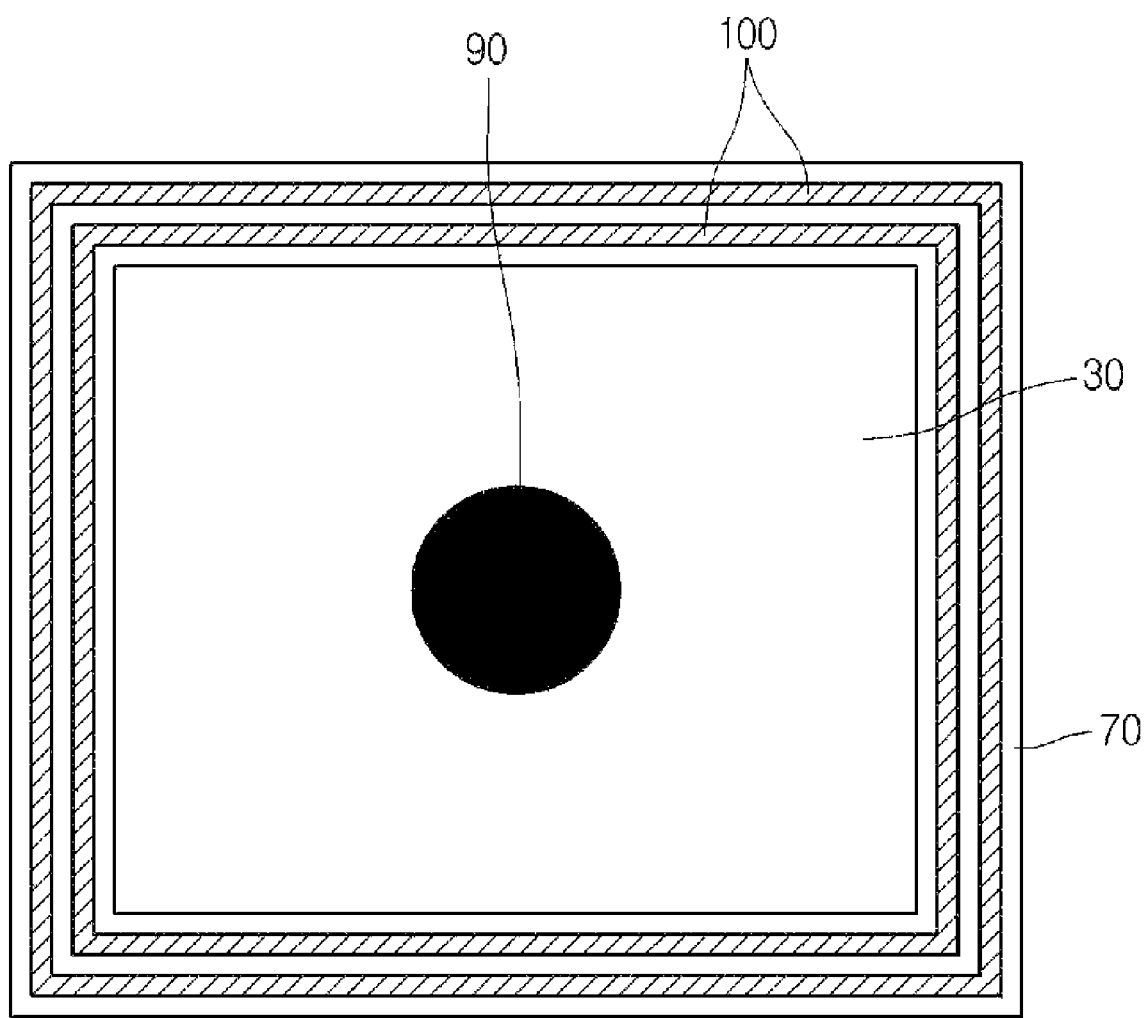
FIG. 9 is a plan view showing the light emitting device according to the embodiments of the present invention.

FIGS. 1 and 6 are sectional views showing a light emitting device and a method of manufacturing the same according to a first embodiment of the present invention, and FIG. 7 is a sectional view showing a light emitting device according to a second embodiment of the present invention. FIGS. 8 and 9 are a plan view showing the light emitting device according to the embodiments of the present invention.

Referring to FIG. 6, the light emitting device according to the first embodiment of the present invention includes a second electrode layer 70, an ohmic contact layer 60 formed on the second electrode layer 70, a light emitting semiconductor layer including a second conductive semiconductor layer 50, an active layer 40, and a first conductive semiconductor layer 30 formed on the ohmic contact layer 60, and a first electrode layer 90 formed on the first conductive semiconductor layer 30. In addition, a reflective member 100 having an inclined surface is formed at a side of the light emitting semiconductor layer including the second conductive semiconductor layer 50, the active layer 40, and the first conductive semiconductor layer 30.

The first conductive semiconductor layer 30 may include a nitride-based semiconductor layer having N-type impurities, and the second conductive semiconductor layer 50 may include a nitride-based semiconductor layer having P-type impurities. The active layer 40 may include a nitride-based semiconductor layer having a multiple quantum well structure such that electrons are combined with holes to produce light.

The reflective member 100 may include a second conductive semiconductor, a stack structure of the second conductive semiconductor layer and the active layer, or a stack structure of the second conductive semiconductor layer, the active layer, and the first conductive semiconductor layer.

In other words, the reflective member 100 may include a nitride-based semiconductor layer similarly to the light emitting semiconductor layer.

The reflective member 100 is provided at the side of the light emitting semiconductor layer including the second conductive semiconductor layer 50, the active layer 40, and the first conductive semiconductor layer 30 while being spaced apart from the light emitting semiconductor layer. Accordingly, the reflective member 100 reflects light, which is emitted from the active layer 40 through a lateral side thereof, upwardly.

Therefore, light emitted from the light emitting device according to the present embodiment is forwarded upwardly, so that the light emitting efficiency of the light emitting device can be improved.

FIG. 7 is a sectional view showing the light emitting device according to the second embodiment of the present invention. The light emitting device according to the second embodiment is similar to the light emitting device according to the first embodiment.

In order to improve the light emitting efficiency by the reflective member 100, a reflective layer 110 is formed at a lateral side of the reflective member 100. The reflective layer 110 may include gold (Ag) or aluminum (Al) representing superior reflectance.

FIGS. 8 and 9 are plan views showing the light emitting device according to the embodiments. The reflective member 100 is formed at a side of the light emitting semiconductor layer including the second conductive semiconductor layer 50, the active layer 40, and the first conductive semiconductor layer 30 while being spaced apart from the light emitting semiconductor layer. The reflective member 100 may be provided in the form of a dot or a fence. The reflective member 100 may surround the light emitting semiconductor layer including the second conductive semiconductor layer 50, the active layer 40, and the first conductive semiconductor layer 30.

In addition, the reflective member 100 may be provided in the combination form of the dot and the fence. For example, the reflective member 100 may include one of fence type reflective members shown in FIG. 9, and the dot type reflective member shown in FIG. 8.

Hereinafter, the method of manufacturing the light emitting device according to the embodiment will be described in detail with reference to FIGS. 1 to 6.

Referring to FIG. 1, an un-doped GaN layer 20, the first conductive semiconductor layer 30, the active layer 40, and the second conductive semiconductor layer 50 are formed on a substrate 10. In addition, a buffer layer (not shown) may be interposed between the substrate 10 and the un-doped GaN layer 20.

The substrate 10 may include at least one of sapphire ($Al_2O_3$), silicon (Si), silicon carbide (SiC), gallium arsenide (GaAs), zinc oxide (ZnO), and magnesium oxide (MgO).

The buffer layer may include a multi-layer having a stack structure such as AlInN/GaN, $InxGa_{1-x}$N/GaN, or $Al_xIn_yGa_{1-x-y}$N/$In_xGa_{1-x}$N/GaN. For example, the buffer layer may be grown by injecting trimethyl-gallium (TMGa), trimethyl-indium (TMIn) and trimethyl-aluminum (TMAl) into a chamber together with hydrogen gas and ammonia gas.

The un-doped GaN layer 20 may be grown by injecting TMGa into the chamber together with hydrogen gas and the ammonia gas.

The first conductive semiconductor layer 30 may include a nitride-based semiconductor layer implanted with first conductive impurity ions. For example, the first conductive semiconductor layer 30 may be a semiconductor layer implanted with N-type impurity ions. The first conductive semiconductor layer 30 may be grown by injecting TMGa and silicon nitride ($SiN_4$) including N-type impurities (e.g., Si) into the chamber together with hydrogen gas and ammonia gas.

Then, the active layer 40 and the second conductive semiconductor layer 50 are formed on the first conductive layer 30.

The active layer 40 may have a single quantum well structure or a multi-quantum well structure. For example, the active layer 40 may include a stack structure of an InGaN well layer/a GaN barrier layer.

The second conductive semiconductor layer 50 may include a nitride-based semiconductor layer implanted with second conductive impurity ions. For example, the second conductive semiconductor layer 50 may include a semiconductor layer implanted with P-type impurity ions. The second conductive semiconductor layer 50 may be grown by injecting TMGa and bis-ethylcyclopentadienyl magnesium ($EtCp_2Mg$) {$Mg(C_2H_5C_5H_4)_2$} including p type impurities (for example, Mg) into the chamber together with hydrogen gas and ammonia gas.

Figure 2:
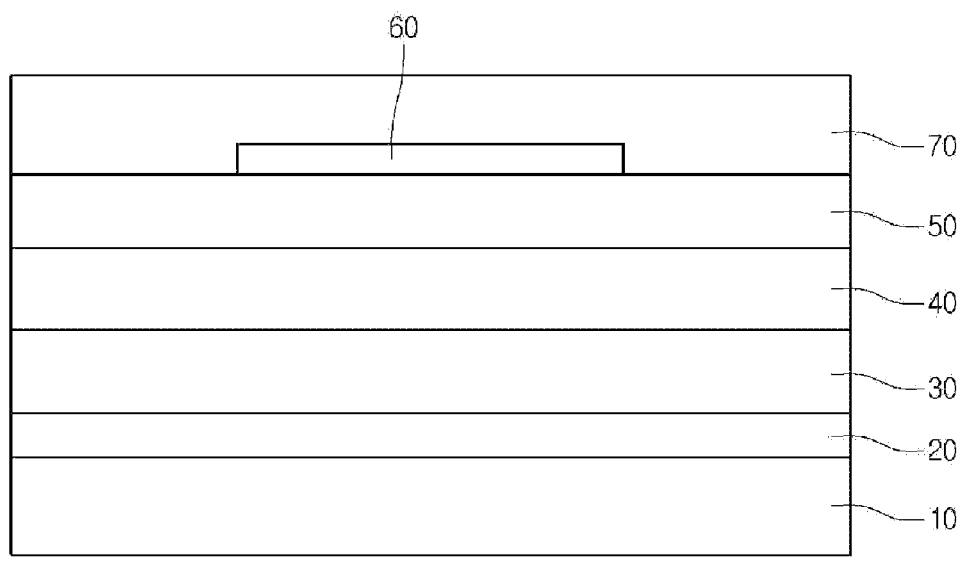

Referring to FIG. 2, the ohmic contact layer 60 and the second electrode layer 70 are formed on the second conductive semiconductor layer 50.

The ohmic contact layer 60 may include a transparent electrode layer. For example, the ohmic contact layer 60 may include at least one of ITO, ZnO, $RuO_x$, $TiO_x$, and $IrO_x$.

The ohmic contact layer 60 may include at least one of a reflective layer and an adhesive layer.

The second electrode layer 70 may include at least one of titanium (Ti), chromium (Cr), nickel (Ni), aluminum (Al), platinum (Pt), gold (Au), and a conductive substrate.

Figure 3:
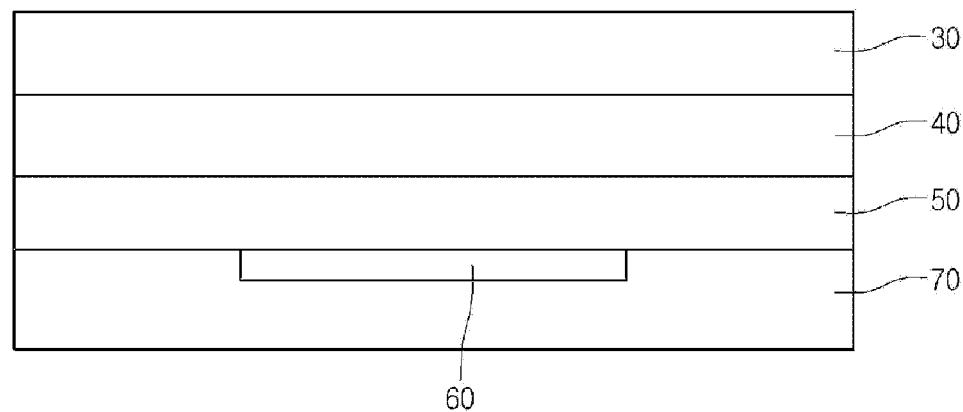

Referring to FIG. 3, the substrate 10 and the un-doped GaN layer 20 are removed from the resultant structure of FIG. 2. If the buffer layer has been formed, the buffer layer is removed.

Figure 4:
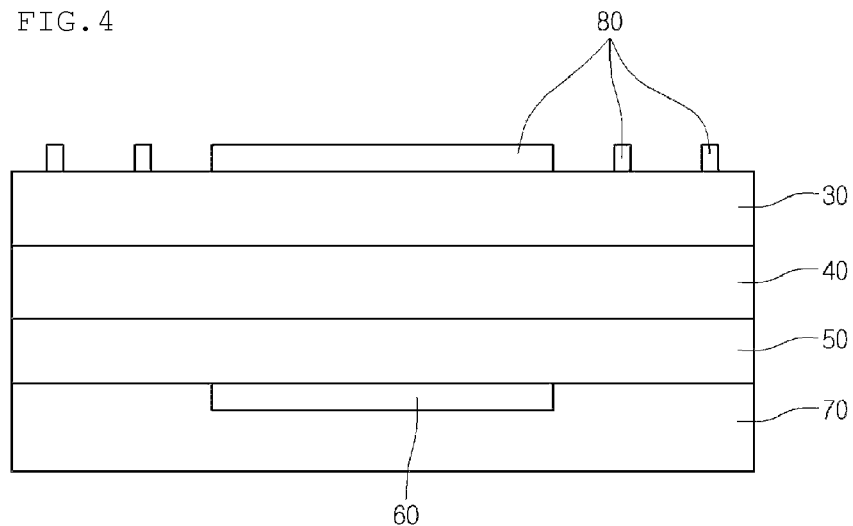

Referring to FIG. 4, a mask 80 is formed on the first conductive semiconductor layer 30 in the resultant structure of FIG. 3.

The stack structure of the second conductive semiconductor layer 50, the active layer 40, and the first conductive semiconductor layer 30 is selectively etched through a dry etch process using the mask 80.

Figure 5:
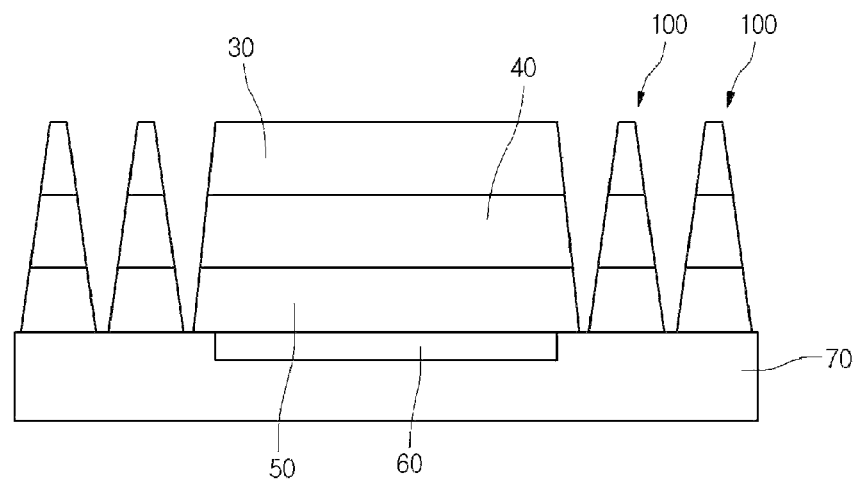

Referring to FIG. 5, after forming the light emitting semiconductor layer including the second conductive semiconductor layer 50, the active layer 40, and the first conductive semiconductor layer 30 in order to emit light through the etch process of FIG. 4, the reflective member 100 is formed at the side of the light emitting semiconductor layer while being spaced apart from the light emitting semiconductor layer.

In this case, the reflective member 100 may include a stack structure of the second conductive semiconductor layer, the active layer, and the first conductive semiconductor layer.

Referring to FIG. 6, the first electrode layer 90 is formed on the first conductive semiconductor layer 30.

Meanwhile, as described above, the reflective layer 110 may be formed on the surface of the reflective member 100. If the reflective layer 110 is additionally formed, the structure of FIG. 7 is obtained.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

INDUSTRIAL APPLICABILITY

The embodiment can be adapted to a light emitting device used as a light source.

What is claimed is:

1. A light emitting device comprising:
   a second electrode layer;
   a stacked structure comprising a second conductive type semiconductor layer on the second electrode layer, an active layer on the second conductive type semiconductor layer, and a first conductive type semiconductor layer on the active layer;
   a first electrode layer on the first conductive type semiconductor layer;
   a reflective member spaced from a side surface of the stacked structure; and
   an ohmic contact layer disposed between the second electrode layer and the second conductive type semiconductor layer.

2. A method of fabricating a light emitting device, the method comprising:
   forming an un-doped GaN layer, a first conductive type semiconductor layer, an active layer, and a second conductive type semiconductor layer on a substrate;
   forming a second electrode layer on the second conductive type semiconductor layer;
   removing the substrate and the un-doped GaN layer;
   forming a mask on the first conductive type semiconductor layer and etching therethrough such that forming a stacked structure for emitting light and a reflective member spaced from the stacked structure; and
   forming a first electrode layer on the first conductive type semiconductor layer.

3. The method according to claim 2, comprising forming a reflective layer on a surface of the reflective member.

4. The method according to claim 2, wherein the reflective member comprises the second conductive type semiconductor layer, the active layer, and the first conductive type semiconductor layer, which are stacked on each other.

5. The method according to claim 2, wherein the reflective member is spaced from the lateral surface of the stacked structure and has at least one of a plurality of dot shapes and a fence shape.

\* \* \* \* \*